United States Patent [19]

Bonikowski et al.

[11] 4,227,145
[45] Oct. 7, 1980

[54] APPARATUS FOR DETECTING FAULTS IN ELECTRIC CABLES

[75] Inventors: Zbigniew Bonikowski, Iver; Suhas Ghanashyamkulkarni; Anthony A. Briant, both of London, all of England

[73] Assignee: BICC Limited, London, England

[21] Appl. No.: 825,227

[22] Filed: Oct. 19, 1977

[51] Int. Cl.³ .................. G01R 31/02; H02H 3/093
[52] U.S. Cl. ........................ 324/51; 361/100
[58] Field of Search ............ 324/51, 73 R, 54, 126, 324/102, 103, 103 P; 361/5, 100

[56] References Cited

U.S. PATENT DOCUMENTS

| | | | |
|---|---|---|---|
| 2,815,481 | 12/1957 | Rohats | 324/54 |
| 2,858,507 | 10/1958 | Liautaud et al. | 324/51 X |
| 2,932,791 | 4/1960 | Carrington | 324/54 X |
| 3,005,150 | 10/1961 | Behr | 324/54 |
| 3,211,998 | 10/1965 | Kidwell | 324/54 |
| 3,339,136 | 8/1967 | Rasor et al. | 324/54 |
| 3,491,290 | 1/1970 | Peschel | 324/54 |
| 3,532,900 | 10/1970 | Rhyne | 361/5 X |
| 3,535,592 | 10/1970 | Roveti | 361/100 |
| 3,544,845 | 12/1970 | Spyrov | 361/100 X |
| 3,548,289 | 12/1970 | Liska et al. | 361/100 X |
| 3,611,133 | 10/1971 | Tsergas et al. | 324/51 X |
| 3,719,884 | 3/1973 | Laroche | 324/54 |
| 3,753,088 | 8/1973 | Ettelman | 324/51 |
| 3,792,289 | 2/1974 | Kazem | 361/100 X |
| 3,916,309 | 10/1975 | Foulkes et al. | 324/103 P |
| 4,045,732 | 8/1977 | Yashiro et al. | 324/103 P |

Primary Examiner—Gerard R. Strecker
Attorney, Agent, or Firm—Buell, Blenko & Ziesenheim

[57] ABSTRACT

Apparatus is provided for use in combination with an electric power distribution cable and the normal source of voltage supply to said cable, the cable being connected between said normal source of voltage supply and at least one load normally applied to said cable, said apparatus detecting faults in said power cable and comprising a solid state switch unit comprising two thyristors arranged in an inverse-parallel configuration and continuously conducting current up to a pre-set maximum and becoming non-conductive after conducting a current in excess of the pre-set maximum for a pre-set period, a metering unit connected to said solid state switch unit for indicating the size of a current flowing through said cable, said metering unit including means for measuring the current in the solid state switch unit, and a trigger circuit connected to said solid state switch unit and metering unit which includes a manually operated trigger switch so connected to said solid state switch unit that when the trigger switch is actuated the trigger circuit will render the switch unit conductive, period measuring means connected to said solid state switch unit maintaining said switch unit conductive for said pre-set period, said apparatus in use being connected in series between said cable and said normal source of voltage supply to the cable when said cable is on load, whereby the trigger circuit will maintain said switch unit electrically conductive for a pre-set period long enough to allow the metering unit to indicate the size of the current flowing through said cable and hence the existence or otherwise of a fault in said cable but not long enough for said current to damage the apparatus, the cable under test and the normal source of voltage supply to the cable.

15 Claims, 1 Drawing Figure

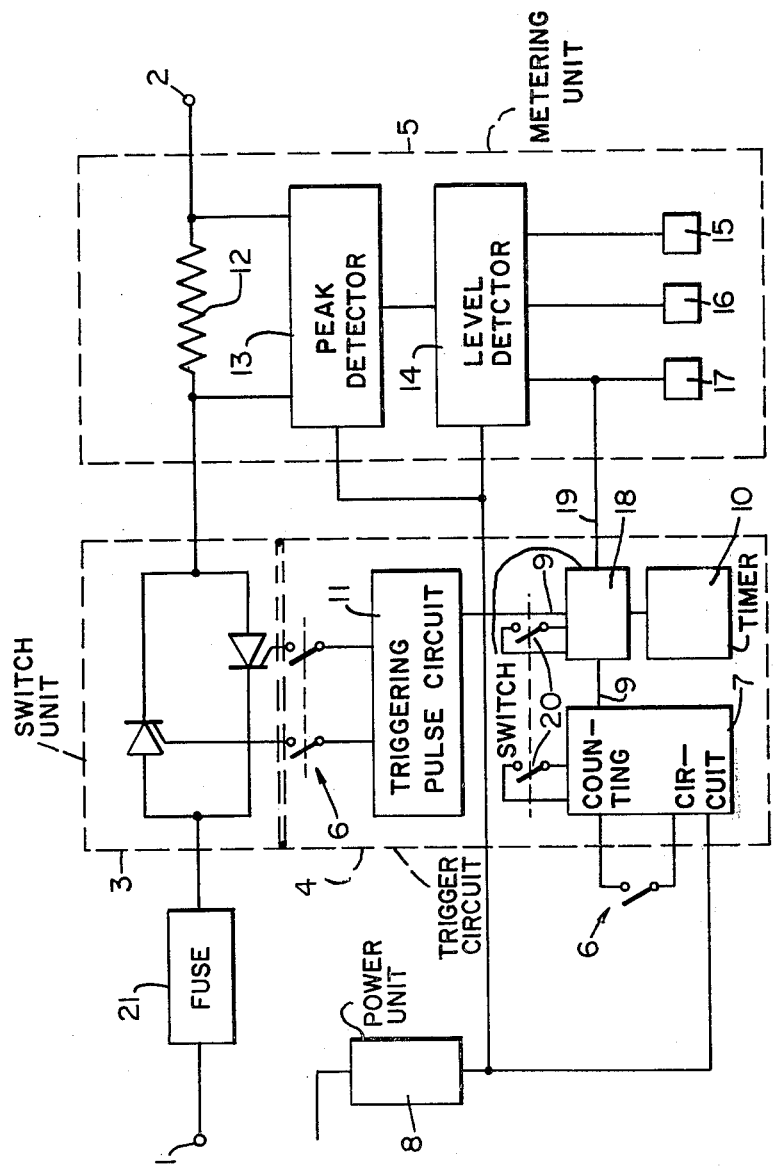

APPARATUS FOR DETECTING FAULTS IN ELECTRIC CABLES

This invention relates to apparatus for use in detecting faults in electric cables.

It is known to test cables for faults by connecting them to an appropriate source of voltage through a fuse of chosen current rating. Blowing of the fuse indicates that the current flowing is greater than the rated current and this allows an estimation of the state of the cable to be made. If desired, fuses of progressively larger value can be employed, in turn, until an upper limit is found to the current flowing under test conditions. Apart from the fact that each test may involve the destruction of one or more expensive fuses, the method gives only an approximate indication of the size of the test current. However, the use of a fuse is convenient because it combines the function of indicating the size of the current with that of cutting off the current before any damage can be done to the cable or supply.

The present invention provides apparatus for use in detecting faults in an electric cable, which apparatus not only provides an indication of the size of the test current and cuts off the current before any damage can be done to the cable under test but is not destroyed by the test and can be employed time and time again.

According to the invention the apparatus comprises a solid state switch unit, a metering unit which includes a resistor connected in series with said switch unit, and a trigger circuit which includes a manually operated trigger switch so connected to said switch unit that when the trigger switch is actuated the trigger circuit will render the switch unit conductive, the arrangement being such that when in use said apparatus is connected in series between the cable under test and the normal source of voltage supply of the cable when it is on load, the trigger circuit will maintain said switch unit electrically conductive for a pre-set period long enough to allow the metering unit to indicate the size of the test current flowing through said resistor but not long enough for said current to damage the apparatus, the cable under test and said normal voltage supply of the cable.

Preferably, the solid state switch unit comprises two thyristors arranged in an inverse-parallel configuration. Such thyristors are capable of conducting currents up to a stated maximum value for long periods of time but can only safely conduct larger currents for restricted periods of time. The pre-set period for which the trigger circuit is arranged to render the switch unit conductive is of such a length that test currents much larger than the maximum allowed for continuous operation can pass during the test without damaging the switch unit thyristors; by way of example, a typical pre-set period lies in the range 8 to 12 cycles. Preferably, also, the trigger circuit is arranged to render the switch non-conductive before the end of the pre-set period if the metering unit indicates a test current larger than that which can be safely conducted for the whole of the pre-set period.

The trigger circuit is preferably formed from solid-state components and where the switch unit is formed from thyristors is preferably connected to their gate electrodes via an isolating transformer and/or protective diodes. The pre-set period may be controlled by a timing circuit, for example a monostable multivibrator of pre-set period, but where the normal voltage supply of the cable is an AC voltage, preferably the apparatus includes a counting circuit which will count the cycles of the AC up to a pre-set maximum. A preferred embodiment includes both such a counting circuit and a timing circuit of similar period to provide protection against failure of either one of the circuits.

Preferably, the metering unit comprises a peak detector circuit with fast transient response arranged to measure the voltage developed across the resistor connected in series with the solid state switch unit. The voltage developed across the resistor may be applied to the peak detector via an isolating transformer and/or a full-wave rectifier and/or a voltage divider. The output of the peak detector is peferably fed to a level detector which controls a visual and/or audible indicator or set of such indicators, each indicator of the set being operable at a peak current flow that is different from those of the other indicators of the set.

Preferably the apparatus includes a fuse which is connected in series with the solid state switch unit and which may be of the fast-blow type rated to blow before any damage can be done to the switch unit by the passage of too large a current for too long a time. Whether or not such a fast-blow fuse is provided, it is desirable that the apparatus also includes, connected in series with the solid state switch unit, in the series circuit, a fuse of the conventional HCR type in order to protect personnel using the apparatus from the potentially dangerous effects of very large current. Such a safety fuse will normally be rated to blow on the passage of a very large current and, being of a slow-blow type, will not normally protect the switch unit.

Preferably the trigger switch of the trigger circuit is a push-button switch arranged so that release of the switch before the end of the pre-set period will turn off the switch unit. Accidental operation of the apparatus is preferably prevented by employing a re-set switch arranged to re-set the apparatus after a test operation, the trigger switch being inactive until the re-set switch has been activated. The indicator or indicators employed to display the size of the test current may be arranged to remain lit until the re-set switch is actuated. The re-set switch itself may be held inactive until the apparatus is ready for the next test operation, for example until the apparatus has cooled down from the heating effects of a previously applied large test current.

The apparatus may be housed in a single casing, in which case the indicators may be mounted on the outside of the casing so as to be visible from a remote operating position. The re-set and trigger switches may also be mounted on the casing, but preferably the trigger switch is connected to the apparatus by a length of flexible cable to allow the apparatus to be actuated from a remote operating station. Where a fuse is provided it may also be situated inside the casing, but in the case of a slow-blow safety fuse it is preferably situated to provide the greatest degree of protection for an operator.

The invention will be further illustrated by a description, by way of example, of preferred apparatus for testing the state of a low voltage distribution cable with reference to the accompanying drawing which shows a block circuit diagram of the apparatus.

Referring to the drawing, the apparatus is connected in series between the cable 2 under test and its normal voltage supply 1 and comprises a solid state switch unit 3, a metering unit 5 which includes a resistor 12 which is connected in series with the switch unit and, associated with the switch unit, a trigger circuit 4 which, on actuation of a trigger switch 6 connected to the switch unit, is arranged to render the switch unit conductive and which, after a pre-set time period has elapsed, is arranged to render the switch unit non-conductive. The normal voltage supply 1 of the cable is a busbar on the local distribution board to which is also connected a voltage source 8 for the electronic circuitry of the metering unit 5 and the trigger circuit 4.

The switch unit 3 comprises a pair of thyristors connected in inverse-parallel configuration, signals from the trigger circuit 4 being applied to the gate electrodes of the thyristors via the trigger switch 6 and an isolating transformer and protection diodes (not shown).

The metering unit 5 comprises a peak detector circuit 13 arranged to monitor the voltage developed across the resistor 12, the voltage being applied to circuit 13 via an isolating transformer, full-wave rectifier and voltage divider (not shown). The peak detector circuit 13 has a fast transient response and its output is fed to a level detector 14 which, depending on the input, selectively lights one of three light-emitting diodes 15, 16 and 17.

The thyristors of the switch unit 3 have a steady current rating of 150 A with a capacity of 700 A rms for 10 cycles and 2500 A rms for one cycle maximum, the $I_2t$ rating being 75000 $A^2$ sec. The level detector 14 is adjusted so that, using a 0.2 ohm resistor for resistor 12, the light-emitting diodes 15 and 16, respectively, light at currents of 500 A and 750 A. The level detector 14 is also adjusted so that a current of 1000 A or more will cause the light-emitting diode 17 to light and to remain lit via a latching circuit until a resetting switch 20 is operated. Output from the level detector 14 which represents a current too large to be safely allowed to flow for the whole of the pre-set period, is also fed via a line 19 to trigger circuit 4. The pre-set period is 10 cycles (200 m sec) but energisation of line 19 is arranged to inhibit triggering of the thyristors so that a current of 1000 A or more will only flow for half of one cycle.

The trigger circuit 4 comprises a counting circuit 7 which is set to zero by the re-set switch 20 and fed via the trigger switch 6 with AC from power unit 8. A zero-crossing detector in circuit 7 clocks a counter which counts up to the pre-set maximum, keeping a line 9 in the circuit energised until the maximum is reached. Line 9 is fed to a triggering pulse circuit 11 via a switch 18 which may be operated by a timer 10 to shut off the signal on line 9 at the end of the pre-set period in case the counter circuit 7 has not done so. Timer 10 comprises a monostable with a suitable period; in the present example the pre-set period is 10 cycles so that the monostable is time to 200 m sec. Switch 18 may also be operated by line 19 as will be described.

The triggering pulse circuit 11 is arranged to energise the gate electrode of the appropriate one of the thyristors for each half-cycle as long as a signal appears on line 9. Thus, if line 9 is energised for the full pre-set period the circuit 11 will energise the thyristors for each of 10 cycles. However, when the signal on line 9 ceases so does the output of circuit 11 and the thyristors cease conducting at the end of the current half-cycle.

The apparatus also includes a fuse 21 which is connected in series with the switch unit 3 and which is of the fast-blow type and will blow before any damage can be done to the thyristors by the passage of too large a current for too long a time. With thyristors having a steady current rating of 150 A, the fuse 21 is rated at 200 A, and has an $I_2t$ rating of 46000 $A^2$ sec. If thyristors capable of handling larger currents are employed, eg thyristors having a steady current rating of 300 A and an $I_2t$ rating of 160000 $A^2$ sec, a fuse rated at 250 A and having an $I_2t$ rating of 100,000 $A^2$ sec would be used. In this latter case, currents of 2000 A rms could be allowed for up to 10 m sec, and the level detector 14 would be adjusted accordingly.

The apparatus is also provided with a safety fuse (not shown) of the slow-blow type rated to prevent the passage of currents large enough to be potentially dangerous to operating personnel. For example, with thyristors of a steady current rating of 150 A and a fast-blow fuse rated at 200 A, the safety fuse may be an 80,000 $A^2$ sec HRC fuse of conventional type.

In operation the trigger switch 6 is operated to allow the trigger circuit 4 to render the switch unit 3 conductive and a test current flowing during the pre-set period is indicated by lighting of one of the three light-emitting diodes, 15, 16 and 17. Release of the trigger switch 6 before the end of the pre-set period causes the trigger circuit 4 to be disconnected from the switch unit 3 and thus render the switch unit non-conductive before the end of the pre-set period. Detection by the metering unit 5 of a current above the safe maximum level causes the light-emitting diode 17 to light and an output to appear at line 19 which operates the switch 18 to terminate operation of trigger circuit 4 even though the pre-set period has not elapsed. After this test operation, the apparatus is held inactive until actuation of the re-set switch 20 re-sets the electronic circuitry of trigger circuit 4 and turns off any signal there may be on line 19 and the light-emitting diode 17.

Re-set switch 20 may be arranged so that it can be operated at any time but, particularly when a maximum current of 1000 A has flowed, it may be advisable to permit the thyristors and resistor 12 to cool for, say, two minutes before the re-set switch is actuated. Alternatively, re-set switch 20 could be held inactive for such a period by a timer or by a temperature detector (eg a bimetallic strip) arranged to prevent re-setting until the apparatus has cooled to the desired extent.

As has previously been described, the apparatus of the present invention can be used time and time again in the testing of electric cables, thereby eliminating the disadvantage arising from the destruction of one or more expensive fuses. In addition, the apparatus may also be employed in the location of a fault in an electric cable conductor by a method in which a pulse derived from an AC voltage, normally applied to the conductor, is generated by the switch unit of the apparatus and is passed along the conductor and in which the energy dissipated by the pulse on reaching a fault in the conductor is detected to determine the location of the fault.

When employed as cable fault location apparatus, the apparatus of the present invention has an important advantage that is not provided by known apparatus for locating a fault in an electric cable conductor. Because the apparatus includes a trigger circuit which, on operation, applies a test voltage for a pre-set period, e.g. 10 cycles, long enough to enable the fault to be located but not long enough for the apparatus or cable to be damaged, the apparatus can be employed to locate a fault in a low voltage distribution cable, e.g. a cable operating at 240 V, whilst the cable is on load. Moreover, by arranging for the value of the resistor in series with the switch unit of the apparatus to be as low as possible, e.g. in the range 0.1 to 0.3 ohm, it is possible to ensure that when the apparatus is being employed to locate or detect a fault in a low voltage cable that is on load, a major proportion of the system voltage is applied across the cable.

What we claim as our invention is:

1. For use in combination with an electric power distribution cable and the normal source of voltage supply to said cable, the cable being connected between said normal source of voltage supply and at least one load normally applied to said cable, apparatus for use in selectively detecting faults in said electric power cable, which apparatus comprises a solid state switch unit comprising two thyristors arranged in an inverse-parallel configuration and continuously conducting current up to a pre-set maximum and becoming non-conductive after conducting a current in excess of the pre-set maximum for a pre-set period, a metering unit connected to said solid state switch unit for indicating the size of a current flowing through said cable, said metering unit including means for measuring the current in the solid state switch unit, and a trigger circuit connected to said solid state switch unit and metering unit which includes a manually operated trigger switch so connection to said solid state switch unit that when the trigger switch is actuated the trigger circuit will render the switch unit conductive, period measuring means connected to said solid state switch unit maintaining said switch unit conductive for said pre-set period, said apparatus in use being connected in series between said cable and said normal source of voltage supply to the cable when said cable is on load, whereby the trigger circuit will maintain said switch unit electrically conductive for a pre-set period long enough to allow the metering unit to indicate the size of the current flowing through said cable and hence the existence or otherwise of a fault in said cable but not long enough for said current to damage the apparatus, the cable under test and the normal source of voltage supply to the cable.

2. For use in combination with an electric power distribution cable and the normal source of voltage supply to said cable, the cable being connected between said normal source of voltage supply and at least one load normally applied to said cable, apparatus for use in selectively detecting faults in said electric power cable, which apparatus comprises a solid state switch unit comprising two thyristors arranged in an inverse-parallel configuration and continuously conducting current up to a pre-set maximum and becoming non-conductive after conducting a current in excess of the pre-set maximum for a pre-set period, a metering unit connected to said solid state switch unit for indicating the size of a current flowing through said cable, said metering unit including means for measuring the current in the solid state switch unit, and a trigger circuit connected to said solid state switch unit and metering unit which includes a manually operated trigger switch so connection to said solid state switch unit that when the trigger switch is actuated the trigger circuit will render the switch unit conductive, period measuring means connected to said solid state switch unit maintaining said switch unit conductive for said pre-set period, and switch terminating means rendering the solid state switch non-conductive prior to the end of the pre-set period if the metering unit indicates a test current larger than that which can be safely conducted during the pre-set interval, said apparatus in use being connected in series between said cable and said normal source of voltage supply to the cable when said cable is on load, whereby the trigger circuit will maintain said switch unit electrically conductive for a pre-set period long enough to allow the metering unit to indicate the size of the current flowing through said cable and hence the existence or otherwise of a fault in said cable and, when the metering unit indicates a current larger than that which can be safely conducted for the whole of the pre-set period without damage to the apparatus, the cable under test and the normal source of voltage supply to the cable, will render the switch unit non-conductive before the end of the pre-set period.

3. Apparatus as claimed in claim 1, wherein the switch unit comprises two thyristors arranged in an inverse-parallel configuration.

4. Apparatus as claimed in claim 1, wherein the trigger circuit includes a counting circuit which, when the voltage source is an AC voltage, will count the cycles of the AC up to a pre-set maximum.

5. Apparatus as claimed in claim 1, wherein the trigger circuit includes a timing circuit for controlling the length of the pre-set period.

6. Apparatus as claimed in claim 5, wherein the timing circuit is a monostable multi-vibrator of pre-set period.

7. Apparatus as claimed in claim 1, wherein the pre-set period is at least 8 cycles.

8. Apparatus as claimed in claim 1, wherein the metering unit includes a resistor connected in series with said switch unit and a peak detector circuit for measuring the voltage developed across the resistor.

9. Apparatus as claimed in claim 8, wherein the value of the resistor lies in the range 0.1 to 0.3 ohm.

10. Apparatus as claimed in claim 8, wherein the metering unit includes a level detector to which the output of the peak detector circuit can be fed and which controls at least one indicator.

11. Apparatus as claimed in claim 1, wherein the apparatus includes, a fuse which is connected in series with the switch unit and which is rated to blow before any damage can be done to the switch unit by the passage of too large a test current for too long a time.

12. Apparatus as claimed in claim 1, wherein the apparatus includes, a safety fuse which is connected in series with the switch unit and which is rated to blow on the passage of a very large current.

13. Apparatus as claimed in claim 1, wherein the trigger circuit includes a manually operable trigger switch and the trigger switch is connected to the trigger circuit by a length of flexible cable to allow the apparatus to be triggered from a remote operating station.

14. Apparatus as claimed in claim 1, wherein the trigger circuit includes a manually operable trigger switch and the trigger switch is push-button switch arranged so that release of the switch before the end of the pre-set period will turn off the switch unit.

15. Apparatus as claimed in claim 1, wherein the trigger circuit includes a manually operable trigger switch and the apparatus includes a re-set switch for re-setting the apparatus after a test operation, the trigger switch being inactive until the re-set switch has been actuated.

* * * * *

UNITED STATES PATENT AND TRADEMARK OFFICE
CERTIFICATE OF CORRECTION

PATENT NO. : 4,227,145

DATED : October 7, 1980

INVENTOR(S) : ZBIGNIEW BONIKOWSKI, SUHAS GHANASHYAMKULKARNI and ANTHONY A. BRIANT It is certified that error appears in the above-identified patent and that said Letters Patent are hereby corrected as shown below:

Column 2, line 14, "peferably" should read --preferably--.

Column 3, line 52, "time" should read --timed--.

Column 6, line 41, Claim 11, after "includes" the comma should be omitted.

Signed and Sealed this

Tenth Day of March 1981

[SEAL]

Attest:

RENE D. TEGTMEYER

Attesting Officer

Acting Commissioner of Patents and Trademarks